United States Patent
Paolini, Jr. et al.

(10) Patent No.: US 10,317,767 B2
(45) Date of Patent: Jun. 11, 2019

(54) ELECTRO-OPTIC DISPLAY BACKPLANE STRUCTURE WITH DRIVE COMPONENTS AND PIXEL ELECTRODES ON OPPOSED SURFACES

(71) Applicant: E INK CORPORATION, Billerica, MA (US)

(72) Inventors: Richard J. Paolini, Jr., Framingham, MA (US); George G. Harris, Woburn, MA (US); Keith A. Jacobsen, Walpole, MA (US); Henry Ware Gale, Westwood, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 15/482,257

(22) Filed: Apr. 7, 2017

(65) Prior Publication Data

US 2018/0196326 A1 Jul. 12, 2018

Related U.S. Application Data

(63) Continuation-in-part of application No. 14/615,617, filed on Feb. 6, 2015, now Pat. No. 9,671,635.
(Continued)

(51) Int. Cl.
*H05K 3/40* (2006.01)
*H05K 3/02* (2006.01)
(Continued)

(52) U.S. Cl.
CPC .......... *G02F 1/167* (2013.01); *G02F 1/13452* (2013.01); *G02F 1/136286* (2013.01);
(Continued)

(58) Field of Classification Search
CPC ...... G02F 1/167; G02F 1/13452; G02F 1/136; G02F 1/286; G02F 2001/136295;
(Continued)

(56) References Cited

U.S. PATENT DOCUMENTS 4,418,346 A  11/1983  Batchelder
5,760,761 A   6/1998  Sheridon
(Continued)

FOREIGN PATENT DOCUMENTS

EP  1099207  5/2001
EP  1145072  10/2001
(Continued)

OTHER PUBLICATIONS

Wood, D., "An Electrochromic Renaissance?" Information Display, 18(3), 24 (Mar. 2002) Mar. 1, 2002.
(Continued)

*Primary Examiner* — Timor Karimy
(74) *Attorney, Agent, or Firm* — Zhen Bao

(57) ABSTRACT

The subject matter presented herein relates to a method for producing a backplane for electro-optic displays. The method may include providing a substrate coated with a first conductive material on a first side and a second conductive material on a second side, the second side being positioned opposite from the first side, patterning the first conductive material by cutting through the first conductive material, wherein the patterning of the first conductive material creates electrical isolated conductive segments to be controlled by a driver circuit and creating a plurality of vias on the substrate, the plurality of vias extending through the substrate and providing electrical conductivity between the first and second sides. The method may further include creating a plurality of conductive traces on the second side of the substrate by patterning the second conductive material by locally align the vias to the driver circuit.

7 Claims, 10 Drawing Sheets

Related U.S. Application Data

(60) Provisional application No. 62/319,685, filed on Apr. 7, 2016, provisional application No. 61/937,168, filed on Feb. 7, 2014.

(51) Int. Cl.
    *G02F 1/167*     (2019.01)
    *G02F 1/1345*     (2006.01)
    *G02F 1/1362*     (2006.01)
    *H05K 3/12*     (2006.01)

(52) U.S. Cl.
    CPC . *H05K 3/027* (2013.01); *G02F 2001/136295* (2013.01); *H05K 3/12* (2013.01); *H05K 3/4053* (2013.01); *H05K 2201/09363* (2013.01); *H05K 2203/107* (2013.01); *H05K 2203/166* (2013.01)

(58) Field of Classification Search
    CPC .......... H05K 1/115; H05K 3/027; H05K 3/04; H05K 3/4038; H05K 2201/10128; H05K 2203/107
    See application file for complete search history.

(56) References Cited

U.S. PATENT DOCUMENTS

| | | |
|---|---|---|
| 5,777,782 A | 7/1998 | Sheridon |
| 5,808,783 A | 9/1998 | Crowley |
| 5,872,552 A | 2/1999 | Gordon, II |
| 6,054,071 A | 4/2000 | Mikkelsen, Jr. |
| 6,055,091 A | 4/2000 | Sheridon |
| 6,097,531 A | 8/2000 | Sheridon |
| 6,124,851 A | 9/2000 | Jacobson |
| 6,128,124 A | 10/2000 | Silverman |
| 6,130,773 A | 10/2000 | Jacobson |
| 6,130,774 A | 10/2000 | Albert |
| 6,137,467 A | 10/2000 | Sheridon |
| 6,144,361 A | 11/2000 | Gordon, II |
| 6,147,791 A | 11/2000 | Sheridon |
| 6,172,798 B1 | 1/2001 | Albert |
| 6,177,921 B1 | 1/2001 | Comiskey |
| 6,184,856 B1 | 2/2001 | Gordon, II |
| 6,225,971 B1 | 5/2001 | Gordon, II |
| 6,232,950 B1 | 5/2001 | Albert |
| 6,241,921 B1 | 6/2001 | Jacobson |
| 6,252,564 B1 | 6/2001 | Albert |
| 6,268,898 B1 | 7/2001 | Ihara |
| 6,271,823 B1 | 8/2001 | Gordon, II |
| 6,301,038 B1 | 10/2001 | Fitzmaurice |
| 6,312,304 B1 | 11/2001 | Duthaler |
| 6,312,971 B1 | 11/2001 | Amundson |
| 6,376,828 B1 | 4/2002 | Comiskey |
| 6,392,786 B1 | 5/2002 | Albert |
| 6,413,790 B1 | 7/2002 | Duthaler |
| 6,422,687 B1 | 7/2002 | Jacobson |
| 6,445,374 B2 | 9/2002 | Albert |
| 6,480,182 B2 | 11/2002 | Turner |
| 6,498,114 B1 | 12/2002 | Amundson |
| 6,506,438 B2 | 1/2003 | Duthaler |
| 6,518,949 B2 | 2/2003 | Drzaic |
| 6,521,489 B2 | 2/2003 | Duthaler et al. |
| 6,535,197 B1 | 3/2003 | Comiskey |
| 6,545,291 B1 | 4/2003 | Amundson |
| 6,639,578 B1 | 10/2003 | Comiskey |
| 6,657,772 B2 | 12/2003 | Loxley |
| 6,664,944 B1 | 12/2003 | Albert |
| 6,667,791 B2 | 12/2003 | Sanford et al. |
| D485,294 S | 1/2004 | Albert |
| 6,672,921 B1 | 1/2004 | Liang |
| 6,680,725 B1 | 1/2004 | Jacobson |
| 6,683,333 B2 | 1/2004 | Kazlas |
| 6,724,519 B1 | 4/2004 | Comiskey |
| 6,750,473 B2 | 6/2004 | Amundson |
| 6,778,312 B2 | 8/2004 | Kawai |
| 6,788,449 B2 | 9/2004 | Liang |
| 6,816,147 B2 | 11/2004 | Albert |
| 6,819,471 B2 | 11/2004 | Amundson |
| 6,825,068 B2 | 11/2004 | Denis |
| 6,831,769 B2 | 12/2004 | Holman |
| 6,842,167 B2 | 1/2005 | Albert |
| 6,842,279 B2 | 1/2005 | Amundson |
| 6,842,657 B1 | 1/2005 | Drzaic |
| 6,865,010 B2 | 3/2005 | Duthaler et al. |
| 6,866,760 B2 | 3/2005 | Paolini, Jr. |
| 6,870,657 B1 | 3/2005 | Fitzmaurice |
| 6,873,452 B2 | 3/2005 | Tseng |
| 6,909,532 B2 | 6/2005 | Chung |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 7,002,728 B2 | 2/2006 | Pullen et al. |
| 7,012,600 B2 | 3/2006 | Zehner |
| 7,012,735 B2 | 3/2006 | Honeyman et al. |
| 7,030,412 B1 | 4/2006 | Drzaic et al. |
| 7,072,095 B2 | 7/2006 | Liang |
| 7,075,502 B1 | 7/2006 | Drzaic |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson et al. |
| 7,144,942 B2 | 12/2006 | Zang |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,190,008 B2 | 3/2007 | Amundson et al. |
| 7,206,119 B2 | 4/2007 | Honeyman et al. |
| 7,223,672 B2 | 5/2007 | Kazlas et al. |
| 7,230,751 B2 | 6/2007 | Whitesides et al. |
| 7,236,291 B2 | 6/2007 | Kaga et al. |
| 7,256,766 B2 | 8/2007 | Albert et al. |
| 7,259,744 B2 | 8/2007 | Arango |
| 7,280,094 B2 | 10/2007 | Albert |
| 7,301,693 B2 | 11/2007 | Chaug |
| 7,304,780 B2 | 12/2007 | Liu |
| 7,312,784 B2 | 12/2007 | Baucom et al. |
| 7,321,459 B2 | 1/2008 | Masuda et al. |
| 7,327,346 B2 | 2/2008 | Chung |
| 7,327,511 B2 | 2/2008 | Whitesides et al. |
| 7,339,715 B2 | 3/2008 | Webber et al. |
| 7,347,957 B2 | 3/2008 | Wu |
| 7,349,148 B2 | 3/2008 | Doshi et al. |
| 7,352,353 B2 | 4/2008 | Albert |
| 7,365,394 B2 | 4/2008 | Denis et al. |
| 7,365,733 B2 | 4/2008 | Duthaler |
| 7,382,363 B2 | 6/2008 | Albert et al. |
| 7,388,572 B2 | 6/2008 | Duthaler et al. |
| 7,401,758 B2 | 7/2008 | Liang |
| 7,411,719 B2 | 8/2008 | Paolini, Jr. et al. |
| 7,420,549 B2 | 9/2008 | Jacobson |
| 7,442,587 B2 | 10/2008 | Amundson et al. |
| 7,453,445 B2 | 11/2008 | Amundson |
| 7,492,497 B2 | 2/2009 | Paolini, Jr. |
| 7,535,624 B2 | 5/2009 | Amundson et al. |
| 7,551,346 B2 | 6/2009 | Fazel |
| 7,554,712 B2 | 6/2009 | Patry et al. |
| 7,560,004 B2 | 7/2009 | Pereira |
| 7,583,427 B2 | 9/2009 | Danner |
| 7,598,173 B2 | 10/2009 | Ritenour |
| 7,605,799 B2 | 10/2009 | Amundson et al. |
| 7,615,325 B2 | 11/2009 | Liang |
| 7,636,191 B2 | 12/2009 | Duthaler |
| 7,649,674 B2 | 1/2010 | Danner |
| 7,667,886 B2 | 2/2010 | Danner |
| 7,672,040 B2 | 3/2010 | Sohn |
| 7,679,814 B2 | 3/2010 | Paolini, Jr. et al. |
| 7,688,497 B2 | 3/2010 | Danner |
| 7,715,088 B2 | 5/2010 | Liang |
| 7,733,335 B2 | 6/2010 | Zehner et al. |
| 7,785,988 B2 | 8/2010 | Amundson |

(56) References Cited

U.S. PATENT DOCUMENTS

| | | |
|---|---|---|
| 7,830,592 B1 | 11/2010 | Sprague |
| 7,839,564 B2 | 11/2010 | Whitesides et al. |
| 7,843,626 B2 | 11/2010 | Amundson et al. |
| 7,859,637 B2 | 12/2010 | Amundson et al. |
| 7,880,958 B2 | 2/2011 | Zang |
| 7,893,435 B2 | 2/2011 | Kazlas et al. |
| 7,898,717 B2 | 3/2011 | Patry |
| 7,905,977 B2 | 3/2011 | Qi |
| 7,957,053 B2 | 6/2011 | Honeyman |
| 7,986,450 B2 | 7/2011 | Cao |
| 8,009,344 B2 | 8/2011 | Danner |
| 8,009,348 B2 | 8/2011 | Zehner |
| 8,027,081 B2 | 9/2011 | Danner |
| 8,049,947 B2 | 11/2011 | Danner |
| 8,072,675 B2 | 12/2011 | Lin |
| 8,077,141 B2 | 12/2011 | Duthaler |
| 8,089,453 B2 | 1/2012 | Comiskey |
| 8,120,836 B2 | 2/2012 | Lin |
| 8,159,636 B2 | 4/2012 | Sun |
| 8,208,193 B2 | 6/2012 | Patry |
| 8,237,892 B1 | 8/2012 | Sprague |
| 8,238,021 B2 | 8/2012 | Sprague |
| 8,319,759 B2 | 11/2012 | Jacobson |
| 8,362,488 B2 | 1/2013 | Chaug |
| 8,373,211 B2 | 2/2013 | Amundson |
| 8,389,381 B2 | 3/2013 | Amundson |
| 8,395,836 B2 | 3/2013 | Lin |
| 8,437,069 B2 | 5/2013 | Lin |
| 8,441,414 B2 | 5/2013 | Lin |
| 8,456,589 B1 | 6/2013 | Sprague |
| 8,498,042 B2 | 7/2013 | Danner |
| 8,514,168 B2 | 8/2013 | Chung |
| 8,547,628 B2 | 10/2013 | Wu |
| 8,576,162 B2 | 11/2013 | Kang |
| 8,610,988 B2 | 12/2013 | Zehner et al. |
| 8,705,164 B2 | 4/2014 | Abe |
| 8,714,780 B2 | 5/2014 | Ho |
| 8,728,266 B2 | 5/2014 | Danner |
| 8,743,077 B1 | 6/2014 | Sprague |
| 8,754,859 B2 | 6/2014 | Gates |
| 8,797,258 B2 | 8/2014 | Sprague |
| 8,797,633 B1 | 8/2014 | Sprague |
| 8,797,636 B2 | 8/2014 | Yang |
| 8,830,560 B2 | 9/2014 | Danner |
| 8,891,155 B2 | 11/2014 | Danner |
| 8,969,886 B2 | 3/2015 | Amundson |
| 8,970,516 B2 * | 3/2015 | Black ............... G02B 26/001 257/257 |
| 9,025,234 B2 | 5/2015 | Lin |
| 9,025,238 B2 | 5/2015 | Chan |
| 9,030,374 B2 | 5/2015 | Sprague |
| 9,140,952 B2 | 9/2015 | Sprague |
| 9,147,364 B2 | 9/2015 | Wu |
| 9,152,003 B2 | 10/2015 | Danner |
| 9,152,004 B2 | 10/2015 | Paolini, Jr. |
| 9,201,279 B2 | 12/2015 | Wu |
| 9,223,164 B2 | 12/2015 | Lai |
| 9,279,906 B2 | 3/2016 | Kang |
| 9,285,648 B2 | 3/2016 | Liu |
| 9,419,024 B2 | 8/2016 | Amundson |
| 9,454,057 B2 | 9/2016 | Wu |
| 2002/0060321 A1 | 5/2002 | Kazlas |
| 2004/0085619 A1 | 5/2004 | Wu |
| 2004/0105036 A1 | 6/2004 | Danner et al. |
| 2005/0122306 A1 | 6/2005 | Wilcox et al. |
| 2005/0122563 A1 | 6/2005 | Honeyman et al. |
| 2006/0255322 A1 | 11/2006 | Wu |
| 2007/0052757 A1 | 3/2007 | Jacobson |
| 2009/0122389 A1 | 5/2009 | Whitesides |
| 2009/0315044 A1 | 12/2009 | Amundson |
| 2010/0177396 A1 | 7/2010 | Lin |
| 2011/0026101 A1 | 2/2011 | Wu |
| 2011/0140744 A1 | 6/2011 | Kazlas |
| 2011/0187683 A1 | 8/2011 | Wilcox |
| 2011/0187689 A1 | 8/2011 | Bishop |
| 2011/0292319 A1 | 12/2011 | Cole |
| 2012/0293858 A1 | 11/2012 | Telfer, Jr. |
| 2012/0320277 A1 | 12/2012 | Takata |
| 2013/0278900 A1 | 10/2013 | Hertel et al. |
| 2014/0078024 A1 | 3/2014 | Paolini, Jr. |
| 2014/0139501 A1 | 5/2014 | Amundson |
| 2014/0192000 A1 | 7/2014 | Hung |
| 2014/0210701 A1 | 7/2014 | Wu |
| 2014/0300837 A1 | 10/2014 | Gates |
| 2014/0368753 A1 | 12/2014 | Cheng |
| 2014/0376164 A1 | 12/2014 | Huang |
| 2015/0005720 A1 | 1/2015 | Zang |
| 2015/0205178 A1 | 7/2015 | Paolini, Jr. |
| 2015/0226986 A1 | 8/2015 | Paolini, Jr. |
| 2015/0227018 A1 | 8/2015 | Paolini, Jr. |
| 2015/0228666 A1 | 8/2015 | Paolini, Jr. |
| 2015/0261057 A1 | 9/2015 | Harris, Jr. |
| 2015/0277160 A1 | 10/2015 | Laxton |
| 2015/0356927 A1 | 12/2015 | Hung |
| 2015/0378235 A1 | 12/2015 | Lin |
| 2016/0012710 A1 | 1/2016 | Lu |
| 2016/0077375 A1 | 3/2016 | Lin |
| 2016/0103380 A1 | 4/2016 | Kayal |
| 2016/0187759 A1 | 6/2016 | Wu |

FOREIGN PATENT DOCUMENTS

| | | |
|---|---|---|
| JP | 2006113157 A | 4/2006 |
| JP | 2008107614 A | 5/2008 |
| JP | 2010181768 A | 8/2010 |
| JP | 2012118342 | 6/2012 |
| KR | 20110080559 A | 7/2011 |
| WO | 2000038000 | 6/2000 |

OTHER PUBLICATIONS

O'Regan, B. et al., "A Low Cost, High-efficiency Solar Cell Based on Dye-sensitized colloidal TiO2 Films", Nature, vol. 353, Oct. 24, 1991, 737-740 Oct. 24, 1991.
Bach, U. et al., "Nanomaterials-Based Electrochromics for Paper-Quality Displays", Adv. Mater, 14(11), 845 (2002) Jun. 5, 2002.
Hayes, R.A. et al., "Video-Speed Electronic Paper Based on Electrowetting", Nature, vol. 425, Sep. 25, pp. 383-385 (2003) Sep. 25, 2003.
Kitamura, T. et al., "Electrical toner movement for electronic paper-like display", Asia Display/IDW '01, p. 1517, Paper HCS1-1 (2001) Jan. 1, 2001.
Yamaguchi, Y. et al., "Toner display using insulative particles charged triboelectrically", Asia Display/IDW '01, p. 1729, Paper AMD4-4 (2001) Jan. 1, 2001.
International Search Report and Written Opinion for PCT/US2015/014842 dated Apr. 28, 2015.
European Patent Office; EP Appl. No. 15745809.2; Extended European Search Report; dated Jun. 16, 2017. Jun. 16, 2017.
Korean Intellectual Property Office, PCT/US2018/024423, International Search Report and Written Opinion, dated Jul. 13, 2018.

* cited by examiner

ELECTRO-OPTIC DISPLAY BACKPLANE STRUCTURE WITH DRIVE COMPONENTS AND PIXEL ELECTRODES ON OPPOSED SURFACES

REFERENCE TO RELATED APPLICATIONS

This application claims priority to U.S. Provisional Application 62/319,685 filed on Apr. 7, 2016. This application is also a continuation in part application to U.S. patent application Ser. No. 14/615,617 filed on Feb. 6, 2015. The Ser. No. 14/615,617 application itself claims priority to U.S. Patent Application No. 61/937,168, filed Feb. 7, 2014. The entire contents of this applications mentioned herein, and of all other U.S. patents and published and copending applications mentioned below, are herein incorporated by reference.

BACKGROUND OF INVENTION

In applications where individual electro-optic displays are filed together to create a larger display, it is optimal for the viewing area to be completely active. Accordingly, this invention relates to an electro-optic display having a backplane with circuit elements on at least two surfaces, a plurality of pixels arranged in a matrix on the front surface of the backplane, at least one driver chip on the reverse surface (opposite the front surface of the backplane), and conductors connecting the plurality of pixels on the front surface to the driver chip on the reverse surface, such that the entire viewing surface area may be optically active.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane.

Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Microcell structures, wall materials, and methods of forming microcells; see for example U.S. Pat. Nos. 7,072,095 and 9,279,906;

(d) Methods for filling and sealing microcells; see for example U.S. Pat. Nos. 7,144,942 and 7,715,088;

(e) Films and sub-assemblies containing electro-optic materials; see for example U.S. Pat. Nos. 6,982,178 and 7,839,564;

(f) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,873,452; 6,909,532; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,301,693; 7,304,780; 7,327,511; 7,347,957; 7,349,148; 7,352,353; 7,365,394; 7,365,733; 7,382,363; 7,388,572; 7,401,758; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,830,592; 7,843,626; 7,859,637; 7,880,958; 7,893,435; 7,898,717; 7,905,977; 7,957,053; 7,986,450; 8,009,344; 8,027,081; 8,049,947; 8,072,675; 8,077,141; 8,089,453; 8,120,836; 8,159,636; 8,208,193; 8,237,892; 8,238,021; 8,362,488; 8,373,211; 8,389,381; 8,395,836; 8,437,069; 8,441,414; 8,456,589; 8,498,042; 8,514,168; 8,547,628; 8,576,162; 8,610,988; 8,714,780; 8,728,266; 8,743,077; 8,754,859; 8,797,258; 8,797,633; 8,797,636; 8,830,560; 8,891,155; 8,969,886; 9,147,364; 9,025,234; 9,025,238; 9,030,374; 9,140,952; 9,152,003; 9,152,004; 9,201,279; 9,223,164; 9,285,648; and 9,310,661; and U.S. Patent Applications Publication Nos. 2002/0060321; 2004/0008179; 2004/0085619; 2004/0105036; 2004/0112525; 2005/0122306; 2005/0122563; 2006/0215106; 2006/0255322; 2007/0052757; 2007/0097489; 2007/0109219; 2008/0061300; 2008/0149271; 2009/0122389; 2009/0315044; 2010/0177396; 2011/0140744; 2011/0187683; 2011/0187689; 2011/0292319; 2013/0250397; 2013/0278900; 2014/0078024; 2014/0139501; 2014/0192000; 2014/0210701; 2014/0300837; 2014/0368753; 2014/0376164; 2015/0171112; 2015/0205178; 2015/0226986; 2015/0227018; 2015/0228666; 2015/0261057; 2015/0356927; 2015/0378235; 2016/077375; 2016/0103380; and 2016/0187759; and International Application Publication No. WO 00/38000; European Patents Nos. 1,099,207 B1 and 1,145,072 B1;

(g) Color formation and color adjustment; see for example U.S. Pat. Nos. 7,075,502 and 7,839,564;

(h) Methods for driving displays; see for example U.S. Pat. Nos. 7,012,600 and 7,453,445;

(i) Applications of displays; see for example U.S. Pat. Nos. 7,312,784 and 8,009,348; and (j) Non-electrophoretic displays, as described in U.S. Pat. No. 6,241,921; and U.S. Patent Applications Publication Nos. 2015/0277160; and applications of encapsulation and microcell technology other than displays; see for example U.S. Pat. No. 7,615,325; and U.S. Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention. Of particular interest, bistable ferroelectric liquid crystal (FLC's) and cholesteric liquid crystal displays are known in the art.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The manufacture of a three-layer electrophoretic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive.

As discussed in the aforementioned U.S. Pat. No. 6,982,178, (see column 3, line 63 to column 5, line 46) many of the components used in electrophoretic displays, and the methods used to manufacture such displays, are derived from technology used in liquid crystal displays (LCD's). For example, electrophoretic displays may make use of a backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with encapsulated electrophoretic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to encapsulated displays. Because the electrophoretic material is solid, it must be present between the backplane and the front electrode before these two integers are secured to each other. Furthermore, in contrast to a liquid crystal material, which is simply placed between the front electrode and the backplane without being attached to either, an encapsulated electrophoretic medium normally needs to be secured to both; in most cases the electrophoretic medium is formed on the front electrode, since this is generally easier than forming the medium on the circuitry-containing backplane, and the front electrode/electrophoretic medium combination is then laminated to the backplane, typically by covering the entire surface of the electrophoretic medium with an adhesive and laminating under heat, pressure and possibly vacuum. Accordingly, most prior art methods for final lamination of solid electrophoretic displays are essentially batch methods in which (typically) the electro-optic medium, a lamination adhesive and a backplane are brought together immediately prior to final assembly, and it is desirable to provide methods better adapted for mass production.

Electro-optic displays, including electrophoretic displays, can be costly; for example, the cost of the color LCD found in a portable computer is typically a substantial fraction of the entire cost of the computer. As the use of such displays spreads to devices, such as cellular telephones and personal digital assistants (PDA's), much less costly than portable computers, there is great pressure to reduce the costs of such displays. The ability to form layers of electrophoretic media by printing techniques on flexible substrates, as discussed above, opens up the possibility of reducing the cost of electrophoretic components of displays by using mass production techniques such as roll-to-roll coating using commercial equipment used for the production of coated papers, polymeric films and similar media.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active-matrix" display. An addressing or pixel electrode, which addresses one pixel, is connected to an appropriate voltage source through the associated non-linear element. Typically, when the nonlinear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode, which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner.

Processes for manufacturing active-matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Electro-optic displays are often used to form large area displays, for example in the form of large signs or billboards. Such large area displays are frequently formed by "tiling" (i.e., juxtaposing) a two-dimensional array of discrete electro-optic displays together since, for technical reasons, such as limitations on the size of backplanes produced by photolithography, individual electro-optic displays cannot economically exceed a certain size. To create the illusion of a single large area display, it is important that the whole visible area of the display be active, with no inactive borders between adjacent displays. Unfortunately, conventional electro-optic displays require driver electronics which are normally disposed around the periphery of the display. Such peripheral driver electronics are not a problem when displays are used individually, since the active area of the display is normally surrounded by a bezel which serves to hide the driver electronics. However, such peripheral driver electronics do create a problem when multiple displays are used to form a large area display since the peripheral areas are inherently optically inactive. Accordingly, there is a need a way of tiling electro-optic displays together to form large area displays without introducing inactive areas in peripheral portions of the individual displays.

Furthermore, to operate electrophoretic displays, it is necessary to arrange for the provision of controllable electric fields across the electro-optic medium to switch the medium among its various optical states, and thus to arrange electrodes on both sides of the medium. In the simplest form of display, each pixel or pixel segment of the display is associated with a separate electrode provided with its own switchable connection to various voltage levels. When assembled, these electrodes form part of the backplane of the display. In some embodiments, a display backplane may be manufactured using either screen printing or as a flexible or rigid printed circuit board (PCB). However, manufacturing cost associated with either methods may prevent them being used for backplanes where pixel or pixel segment designs are unique (e.g., large sized display signs) and only a few such backplane are needed. For example, the tooling cost associated with screen printing may amount to hundreds or thousands of dollars, making it prohibitively expensive for manufacturing backplane designs where only a few backplanes are needed for specific applications. Furthermore, both screen printing or PCB manufacturing are limited to assemble backplanes of 24 inches by 48 inches or less in size for majority of manufacturers. In some instances, larger sized PCBs can be assembled but again the manufacturing cost may be prohibitively expensive if only a few units are needed.

SUMMARY OF INVENTION

The subject matter disclosed herein provides for a method for producing a backplane for electro-optic displays. The method comprises providing a substrate coated with a first conductive material on a first side and a second conductive material on a second side, the second side being positioned opposite from the first side, patterning the first conductive material by cutting through the first conductive material, wherein the patterning of the first conductive material creates electrical isolated conductive segments to be controlled by a driver circuit, creating a plurality of vias on the substrate, the plurality of vias extending through the substrate and providing electrical conductivity between the first and second sides, and creating a plurality of conductive traces on the second side of the substrate by patterning the second conductive material by locally align the vias to the driver circuit.

Additionally provided is another method for producing a backplane for electro-optic displays. The method includes providing a substrate coated with a first conductive material on a first side, patterning the first conductive material by cutting through the first conductive material, wherein the patterning of the first conductive material creates electrical isolated conductive segments to be controlled by a driver circuit, creating a plurality of vias on the substrate, the plurality of vias extending through the substrate and creating a plurality of conductive traces on a second side of the substrate connecting the vias to the driver circuit, the second side being position opposite to the first side of the substrate.

The methods described herein make it possible to create a large are electrophoretic image displays (EPID). Such EPIDs may include, as illustrated in FIG. 4, a backplane 41 of the invention (i.e., comprising a pixel conductive layer 42 with laser scribed driving electrodes, a substrate layer 43 with vias 44-47 penetrating through and conductive traces placed on a reverse side 48 of the substrate coated with conductive material), a front electrode 49 and a display layer 50. The display layer 50 may include electrophoretic pigment particles enclosed in micro-capsules or micro-cups. Illustrated in FIG. 4 are micro-capsules comprising black and white electrophoretic pigment particles. The front electrode 49 may represent the viewing side of the display 40, in which case the front electrode 49 may be a transparent conductor, such as Indium Tin Oxide (ITO) (which in some cases may be deposited onto a transparent substrate, such as polyethylene terephthalate (PET)). In the display of FIG. 4, display layer 50 can be a particle-based medium between electrode layers 49 and 42 that includes a plurality of micro-capsules. Within capsule 51 is a liquid medium and one or more types of colored pigment particles that include white pigment particles 52 and black pigment particles 53. The pigment particles 52 and/or 53 may be controlled (displaced) with an electric field (e.g., produced by electrodes on layers 49 and 42, where electrical driving waveforms can be transmitted to the electrodes on layer 42 from the conductive traces on layer 48 through the vias 44-47), thus making the display 100 operate as an electrophoretic display when addressed.

DETAILED DESCRIPTION

Figure 1:
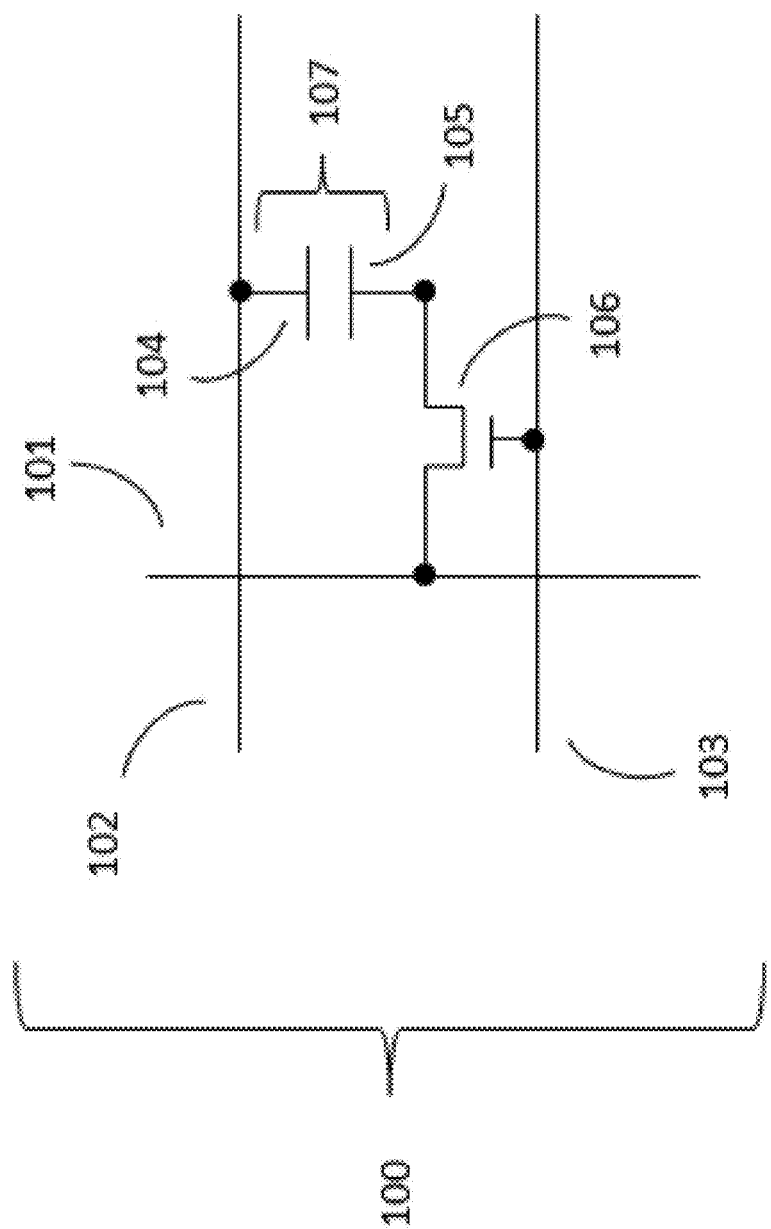
FIG. 1 is a schematic circuit diagram of one pixel of an active matrix electro-optic display according to some embodiments.

The use of electro-optic display technology is expanding beyond electronic document reader applications to a variety of electronic display products including product labels, retail shelf labels, device monitoring indicators, wristwatches, signs, and promotional or advertising displays. Typically, electro-optic displays are encased by a frame or a bezel to hide the electrical connections of the display which generally lay alongside the display. In some applications, specifically, large scale tiled displays, it is generally preferred that the entire viewing area of an electro-optic display be optically active; for example, a billboard made by tiling a plurality of electro-optic displays together to create a large display, where the entire viewing surface of each individual display is optically active and the space between each display is minimized, such that the large display appears as a single continuous display.

Accordingly, this invention provides for an electro-optic display having a backplane with circuit elements on at least two surfaces, a plurality of pixel electrodes arranged in an array of rows and columns on the front surface of the backplane having row and column lines, at least one driver chip on the reverse surface (opposite the front surface of the backplane), and conductive vias connecting the row and column lines of the plurality of pixel electrodes on the front surface to the driver chip on the reverse surface, such that the entire viewing surface area may be optically active.

In another aspect, this invention provides for an electro-optic display having a backplane with two major surfaces wherein a first major surface has a plurality of pixel electrodes, and a second major surface opposed to the first major surface has at least one driver chip, a plurality of gate lines with a conductive via for each gate line, a plurality of source lines with a conductive via for each source line, a plurality of common lines with at least one conductive via to electrically connect the plurality of pixel electrodes to the driver chip, such that the entire viewing surface area may be optically active.

In another aspect, this invention provides for an electro-optic assembly containing a backplane having a plurality of pixel electrodes on the front surface, at least one driver on the reverse surface and electrical connections between the pixel electrodes and the driver, such that almost 100% of the viewing surface may be optically active.

The term "backplane" is used herein consistent with its conventional meaning in the art of electro-optic displays and in the aforementioned patents and published applications, to mean a rigid or flexible material provided with one or more electrodes. The backplane may also be provided with electronics for addressing the display, or such electronics may be provided in a unit separate from the backplane. A backplane may contain multiple layers. A backplane may be referred to as a rear electrode structure. The front surface of a backplane refers to the surface closest to the front electrode of the display. The reverse surface of a backplane refers to the surface farthest from the front electrode.

The term "viewing surface" is used herein consistent with its conventional meaning in the art of electro-optic displays and in the aforementioned patents and published applications, to mean the surface closest to the front electrode (the surface remote from the backplane).

The term "non-viewing surface" is used herein to mean any surface or side that is not the viewing surface. This includes the reverse side of a backplane, the sides of a backplane and, if multi-layered, any layer of the backplane that is not on the viewing surface.

Typically, a backplane has an array of pixel electrodes. Each pixel electrode forms part of a "pixel unit" which usually also includes a thin-film transistor, a storage capacitor, and conductors that electrically connect each pixel unit to a driver chip. Although a pixel electrode is technically a subpart of a pixel unit, the terms "pixel" and "pixel electrode" are commonly used interchangeably and refer to a unit cell of a backplane active area. The terms "column lines" and "row lines" generally refer to the "gate lines" and "source lines" of a pixel transistor. These terms are used interchangeably herein.

FIG. 1 is an illustrative schematic of the circuitry of a type of single thin film transistor pixel (100), including a pixel electrode (105), a capacitor electrode (104), a thin-film transistor (106), a gate line (103), a source line (101) and a common (ground) line (102). The source line (101) is connected to the source of the transistor (106), the gate line (103) is connected to the gate of the transistor (106) and the drain of the transistor (106) is connected to the pixel electrode (105). The capacitor electrode (104) is connected to the ground line (102) so that the pixel electrode (105) and the capacitor electrode (104) together form a storage capacitor (107).

Figure 2:
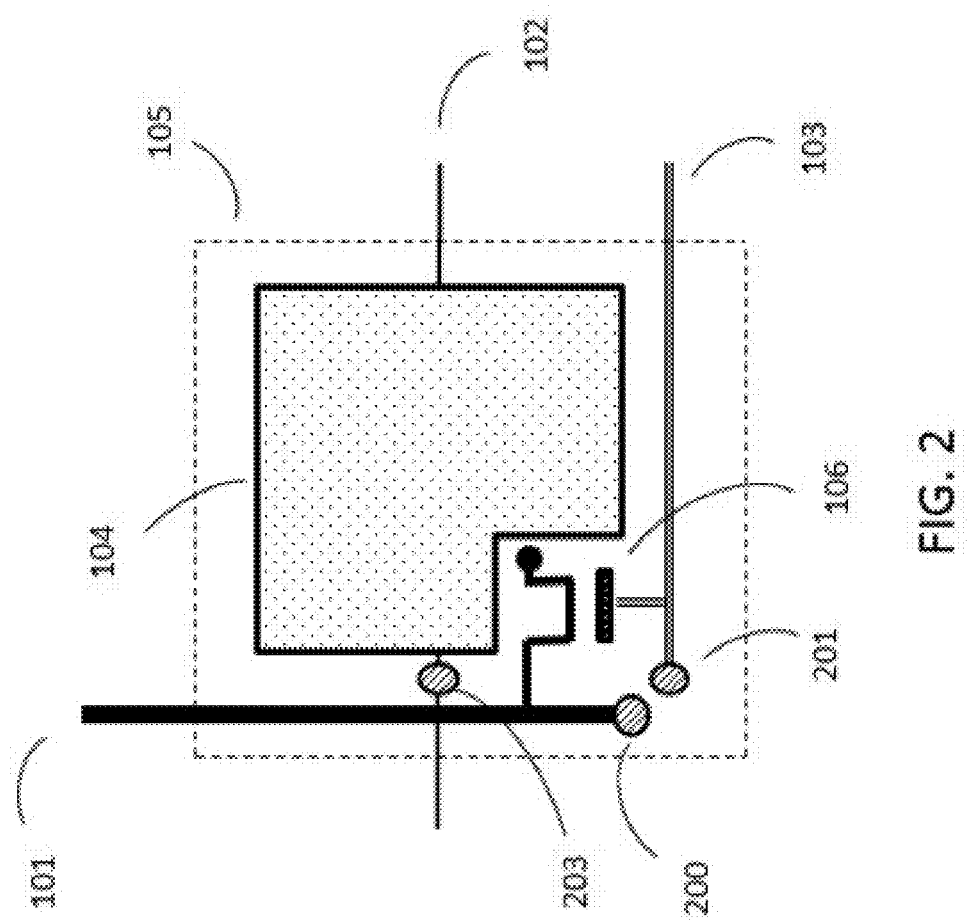
FIG. 2 is a top plan view showing a single pixel of the viewing surface of a display according to some embodiments.

FIG. 2 is an illustrative schematic of the present invention of a single pixel including a pixel electrode (105), a capacitor electrode (104), a thin-film transistor (106), a gate line (103), a source line (101) and a common (ground) line (102). Conductive vias at each gate line (201) and at each source line (200) electrically connect the pixel electrode to the driver on the reverse surface of the backplane. A conductive via (203) connects the ground lines (102) to the driver on the reverse surface.

The thin-film transistor of the pixel electrode may be electrically connected to the driver chip by formation of via apertures through the backplane. The apertures may be filled with conductive material to form vias interconnecting electronic components on the viewing side to electronic components on the reverse side of the backplane. The via apertures may be, for example, etched, punched, drilled or laser-drilled through the polymeric material of the backplane so as to connect the electronic components on the viewing side to the drivers on the reverse side. The via apertures may be filled using a variety of materials and techniques including printing (for example, ink-jet, screen, or offset printing) application of conductive resins, shadow-mask evaporation or conventional photolithographic methods. Simple electrical connections may be made along the edge of the substrate using thick film conductors.

Figure 3:
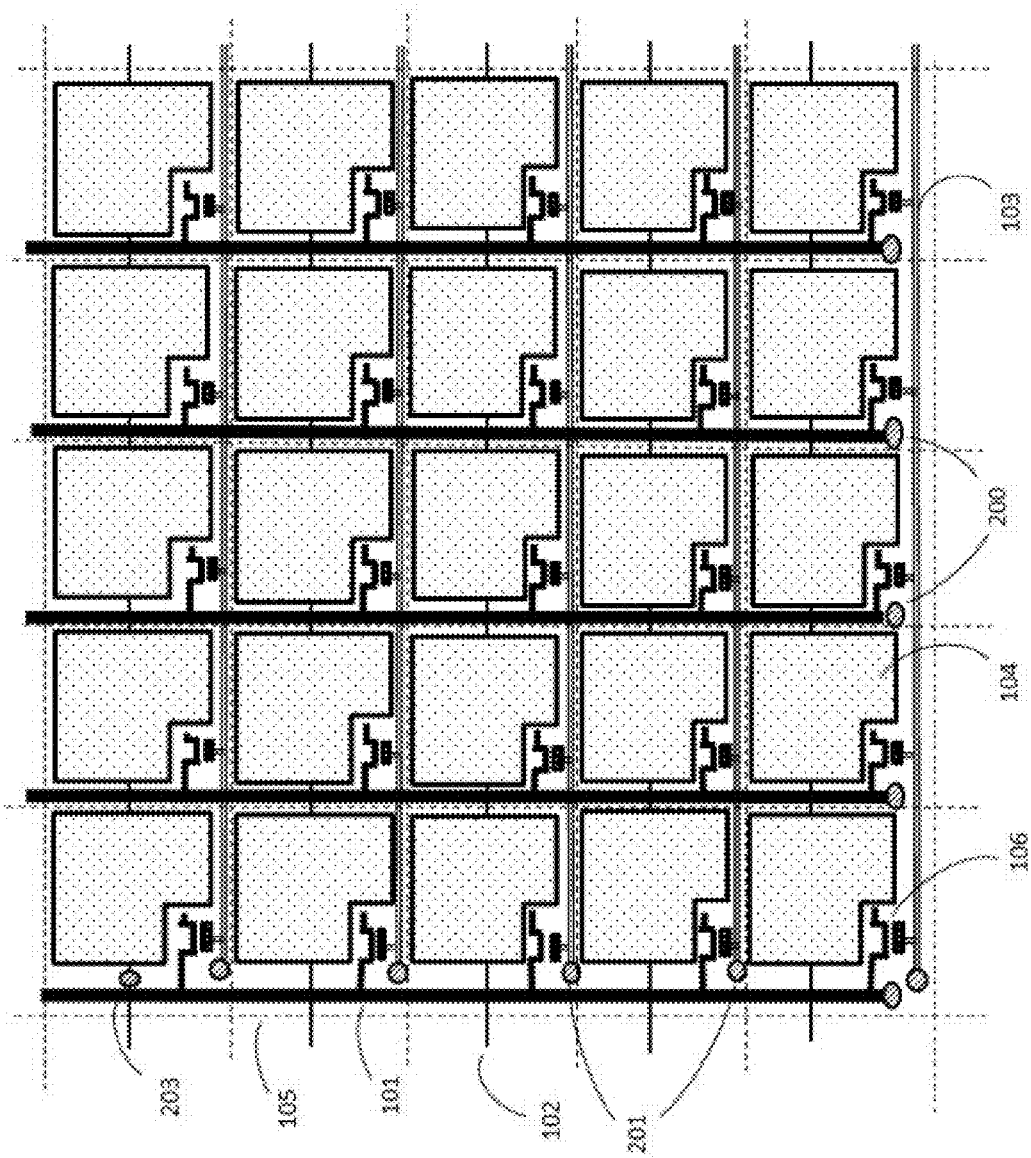
FIG. 3 is a top plan view of the front surface of a backplane of the present invention having a 5×5 pixel array.

FIG. 3 is an illustrative schematic of a 5×5 array of pixels of a backplane of the present invention which includes pixel electrodes (105), capacitor electrodes (104), thin-film transistors (106), gate lines (103), source lines (101), common (ground) lines (102), source line conductive vias (200), gate line conductive vias (201) and a common line conductive via (203). The pixel components are layered or sandwiched between semiconductor layers to provide electrical connections and prevent cross-talk between neighboring components. The pixel electrode, usually, is on the front surface of the backplane and is the closest layer to the viewing surface. The electro-optic layer attaches to the pixel electrode layer such that, essentially, the entire viewing surface is optically active. The pixel electrode layer may be light transmissive when the electro-optic layer acts to mask the underlying components on the backplane.

The array of transistors shown in FIG. 3 can be manufactured using any one of many appropriate methods. For example, vacuum based methods such as evaporation or sputtering can be used to deposit the materials necessary to form the transistor and thereafter the deposited material can be patterned. Alternatively, wet printing methods or transfer methods can be used to deposit the materials necessary to form the transistors. For fabrication of thin-film transistors, the substrate may be, for example: a silicon wafer; a glass plate; a steel foil; or a plastic sheet. The gate electrodes, for example, may be any conductive material such as metal or conductive polymer. The materials for use as the semiconductor layer, for example, can be inorganic materials such as amorphous silicon or polysilicon. Alternatively, the semiconductor layer may be formed of organic semiconductors such as: polythiophene and its derivatives; oligothiophenes; and pentacene. In general, any semiconductive material useful in creating conventional thin film transistors can be used in this embodiment. The material for the gate dielectric layer may be an organic or an inorganic material. Examples of suitable materials include, but are not limited to, polyimides, silicon dioxide, and a variety of inorganic coatings and glasses. The source and gate electrodes may be made of any conductive material such as metal or conductive polymer.

The array of transistors described in reference to FIG. 3 may be any type of transistors used for addressing an electronic display. Additional (i.e., resistors) or alternative (i.e., capacitors and transistors) drive components may be used as well. In another implementation, the addressing electronic backplane could incorporate diodes as the non-linear element, rather than transistors. The present invention is applicable to a variety of electronic displays, including electrophoretic displays, liquid crystal displays, emissive displays (including organic light emitting materials) and rotating ball displays.

Alternatively, a passive matrix backplane rather than an active matrix backplane may be used to drive the display. As is well-known in the art, a passive matrix backplane uses two sets of elongate electrodes extending at right angles to display an image on the screen. Each pixel is defined by the intersection of two electrodes, one from each set. By altering the electrical charge at a given intersection, the electro-optic properties of the corresponding pixel may be changed.

Figure 4:
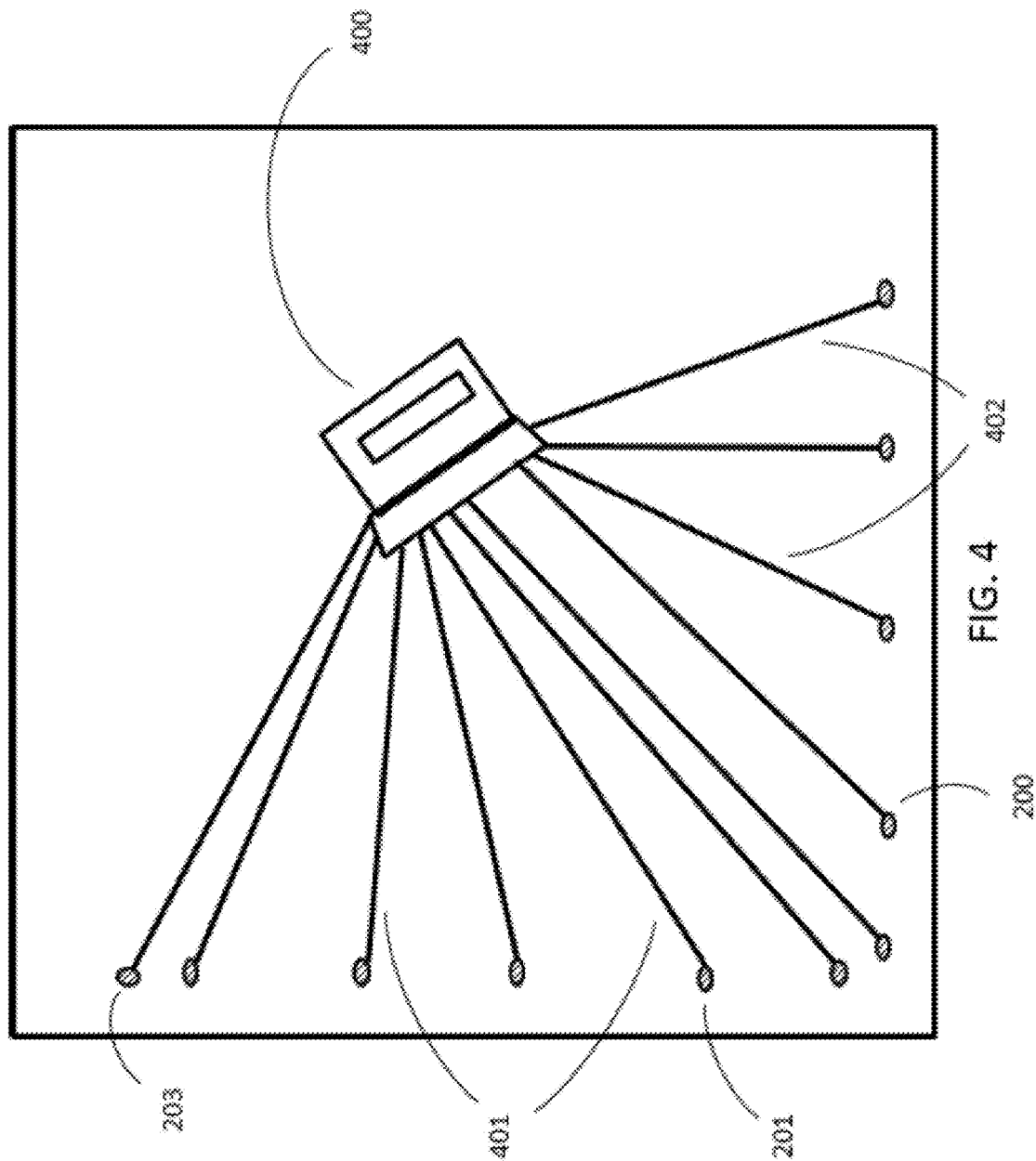
FIG. 4 is a plan view of the reverse surface of the backplane shown in FIG. 3 a single driver and connections thereto.

FIG. 4 is an illustrative schematic of a reverse surface of a backplane of the present invention showing a driver (400), conductive vias (200, 201, 203) and conductors (401, 402) connecting the pixels in a 5×5 array on the front surface to the driver on the reverse surface. FIG. 4 shows the conductive vias located at the end of each column and row according to the preferred embodiment, however, the vias may be located anywhere along the gate and source lines to make the electrical connection.

FIG. 4 illustrates a plan view of the conductive leads and the elements for an array of transistors for driving a display. An array comprises source lines and gate lines with conductive vias connecting a driver to pixel electrodes. To address a pixel electrode, voltages are applied to appropriate source lines and gate lines. Changes in the optical characteristics of a display element are achieved by addressing a pixel electrode that is associated with the display element.

From the foregoing, it will be seen that the present invention provides for an electro-optic assembly containing a backplane having a plurality of pixels arranged in rows and columns on the front surface, at least one driver on the reverse surface and electrical connections between the row and column lines of the pixel array and the driver, such that 100% of the viewing surface may be optically active.

Display size and resolution may be optimized according to the electro-optic display application, substrate materials and PCB design guidelines. Pixel size may vary from approximately 100 µm to more than 10 mm per side (approximately 10,000 µm$^2$ to 100 mm$^2$). Conductive vias may range in size from 25 µm to 250 µm depending on the pixel size of the display. Individual display sizes may range from as large as multiple feet squared to as small as less than an inch squared. For large scale displays with a large viewing distance, a larger pixel size is preferred. For example, a billboard display may be constructed from individual displays of approximately 400 mm×400 mm with 4 mm×4 mm pixels and conductive vias that are approximately 250 µm. For large scale displays with a shorter viewing distance, a smaller pixel size is preferred. For example, a wall display may be constructed from individual displays of approximately 200 mm×200 mm with 200 μm×200 μm pixels.

The number of driver chips may be optimized according to design rules. At least one driver chip may be used. Preferably, at least two driver chips are used; one to drive the gate lines and one to drive the source lines.

Figure 5:
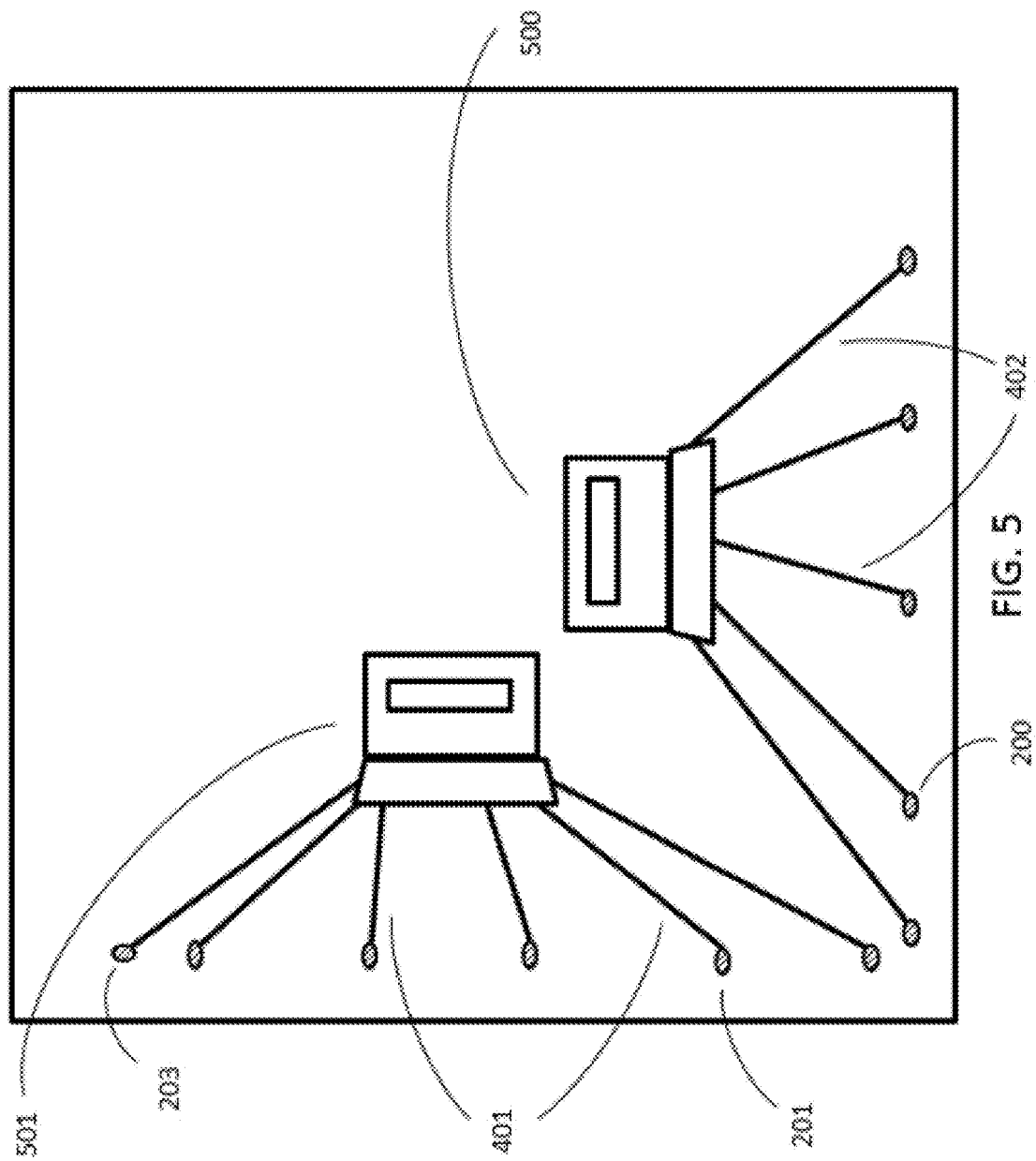
FIG. 5 is a plan view similar to that of FIG. 4 but is an embodiment showing two drivers and connections thereto.

FIG. 5 is an illustrative schematic of the present invention showing two drivers (500, 501), conductive vias to the source lines (200) and gate lines (201), a conductive via to the common lines (203) and conductors (401, 402) connecting the pixels in a 5×5 array on the front surface to the driver on the reverse surface. One driver (500) addresses the source lines and the other driver (501) addresses the gate lines and common lines.

In one aspect of the present invention, a thin-film transistor, capacitor electrode and pixel electrode may be fabricated on the front surface of the backplane while a driver and connecting gate and source lines (and any additional electronic components) are formed on the opposed surface, then the via apertures are formed, and finally the via apertures are filled to form vias. Vias may be filled with a conductive substance, such as solder or conductive epoxy, or an insulating substance, such as epoxy. Alternatively, the gate and source lines may be formed on the front surface of the backplane. In another alternative, the substrate may be drilled and filled to form vias, then, the thin film transistor array is formed with the source and gate lines landing on (aligning with) the conductive vias.

In another alternative, the backplane may be formed by printing the source lines, gates lines and thin film transistors on a substrate, then, drilling an filling conductive vias, then, covering the vias with dialectric and, finally, printing the pixel electrodes.

The backplane substrate material may be any suitable material that allows for the fabrication of one or more via apertures, such as polyester, polyimide, multilayered fiberglass, stainless steel, PET or glass. Holes are punched, drilled, abraded, or melted through where conductive paths are desired, including through any dielectric layers as necessary. Alternatively, the apertures may be formed on the backplane materials prior to assembly and then aligned when assembled. A conductive ink may be used to fabricate and fill the holes. The pixel electrode may be printed using a conductive ink as is known in the art. The ink viscosity, as well as the aperture size and placement, may be optimized so that the ink fills the apertures. When the reverse surface structures are printed, again using conductive ink, the holes are again filled. By this method, the connection between the front and back of the substrate may be made automatically.

The backplane of the display may comprise a substrate having a thin-film transistor array on the front surface, conductive vias located at each column and row, a driver on the reverse surface of the substrate, and gate and source lines connecting the thin-film transistor array to the driver.

Alternatively, a printed circuit board may be used as the rear electrode structure. The front of the printed circuit board may have copper pads etched in the desired shape. The plated vias connect the electrode pads to an etched wire structure (or conductor) on the reverse surface of the printed circuit board. The wires may be run to the reverse surface rear of the printed circuit board and a connection can be made using a standard connector such as a surface mount connector or using a flex connector and anisotropic glue.

Alternatively, a flex circuit such a copper-clad polyimide may be used for the rear electrode structure. Printed circuit board may be made of polyimide, which acts both as the flex connector and as the substrate for the electrode structure. Rather than copper pads, electrodes may be etched into the copper covering the polyimide printed circuit board. The plated through vias connect the electrodes etched onto the substrate the rear of the printed circuit board, which may have an etched conductor network thereon (the etched conductor network is similar to the etched wire structure).

Alternatively, the rear electrode structure can be made entirely of printed layers. A conductive layer can be printed onto the back of a display comprised of a clear, front electrode and a printable display material. A clear electrode may be fabricated from indium tin oxide or conductive polymers such as polyanilines and polythiophenes. A dielectric coating may be printed leaving areas for vias. Then, the back layer of conductive ink may be printed. If necessary, an additional layer of conductive ink can be used before the final ink structure is printed to fill in the holes.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

Moreover, the encapsulated electrophoretic display is highly compatible with flexible substrates. This enables high-resolution thin-film transistor displays in which the transistors are deposited on flexible substrates like flexible glass, plastics, or metal foils. The flexible substrate used with any type of thin film transistor or other nonlinear element need not be a single sheet of glass, plastic, metal foil, though. Instead, it could be constructed of paper. Alternatively, it could be constructed of a woven material. Alternatively, it could be a composite or layered combination of these materials.

Figure 6:
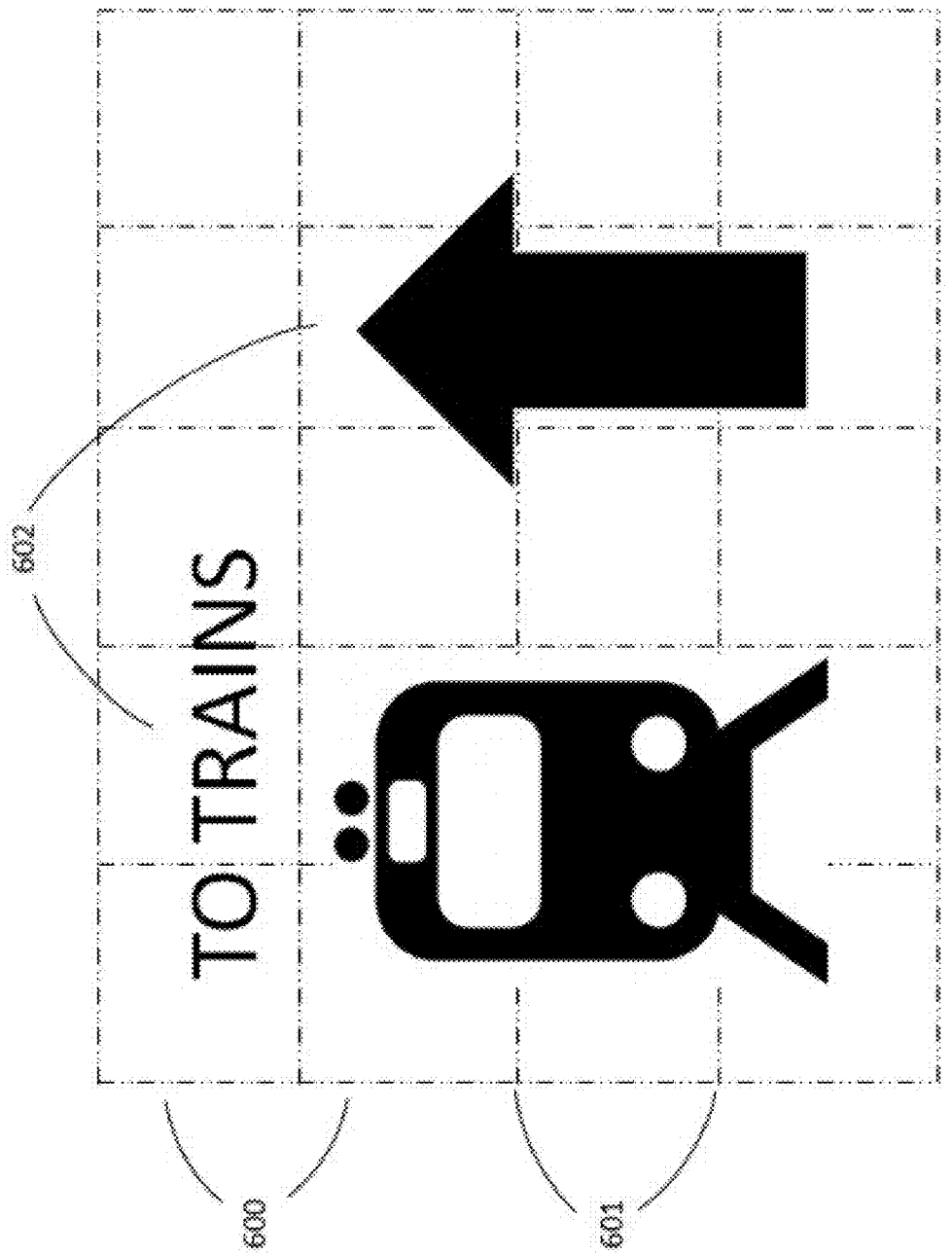
FIG. 6 is an illustrative representation of the present invention used in a large scale sign.
Figure 7:
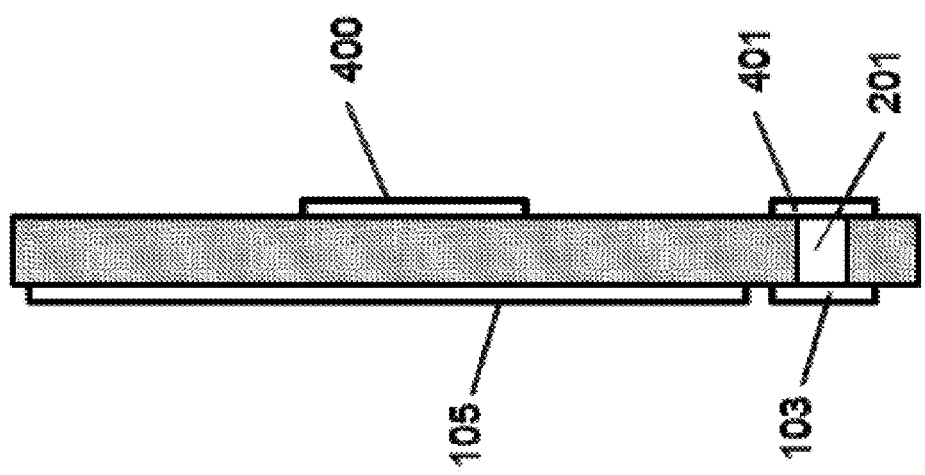
FIG. 7 is a cross-sectional view of a backplane of the invention showing a pixel electrode, via, and driver chip.

FIG. 6 is an illustrative representation of the present invention used in a large scale sign. The individual electro-optic displays (600) are tiled in a 5 by 4 array. The dotted lines (601) represent the edges of the individual displays. This figure shows a sign for a train station that displays icons and words (602) indicating the direction to the trains.

The electro-optic display may have a front plane comprising, in order beginning from the backplane, a layer of electro-optic material disposed on the thin-film transistor array, a single continuous electrode disposed on the electro-optic material and, optionally, a front protective layer or other barrier layers. The upper surface of the protective layer forms the viewing surface of the display. An edge seal may extend around the periphery of the electro-optic material to prevent the ingress of moisture to the electro-optic material.

In another aspect, this invention provides for an electro-optic display wherein the electro-optic material masks the electrical connections such that the viewing surface may be completely optically-active. The electro-optic material of the front plane laminate may overlay the pixel electrodes to obscure the backplane connections from the viewing surface. In another aspect, the electro-optic material of the front plane laminate may extend beyond the pixel electrodes to obscure the backplane connections from the viewing surface.

In another aspect, as described in U.S. Pat. No. 8,705,164, front electrode connections may be on a non-viewing side of the backplane. Alternatively, front electrode connections may be made on the viewing surface. Such connections create non-active areas on the viewing surface. These non-active areas are usually approximately 2 mm in diameter but may be larger or smaller depending on the display voltage requirements and the total number of connections. In comparison to the overall active viewing area, the display may still appear to be 100% active. In the present invention, an active viewing area of at least 95% is preferred.

Furthermore, the subject matter presented herein provides for a backplane for use in an electro-optic display, this backplane, in some embodiments, may include a pixel conductor layer, a substrate layer and a reverse side conductor layer, where the substrate layer can be positioned between the pixel conductor layer and the reverse side conductor layer. Driving electrodes for display pixels or pixel segments can be defined and fabricated on the pixel conductor layer. In a preferred embodiment, the driving electrodes are firstly patterned on the pixel conductor layer using a beam of energy or particles (e.g., laser scribing), where laser scribing allows for the fabrication of driving electrodes of various sizes and geometric shapes without using complex machineries. Subsequently, vias can be created through the substrate layer and conductive traces can be drawn on the reverse side conductor layer, where the conductive traces are used for transmitting electrical voltage or driving waveforms to the driving electrodes through the vias. In this fashion, the backplane is assembled without having to use size-limiting techniques such as photolithography or global alignments, techniques usually required by screen printing or PCB manufacturing. As such, large sized backplanes with variable sized driving electrodes can be conveniently and cheaply assembled.

Figure 8:
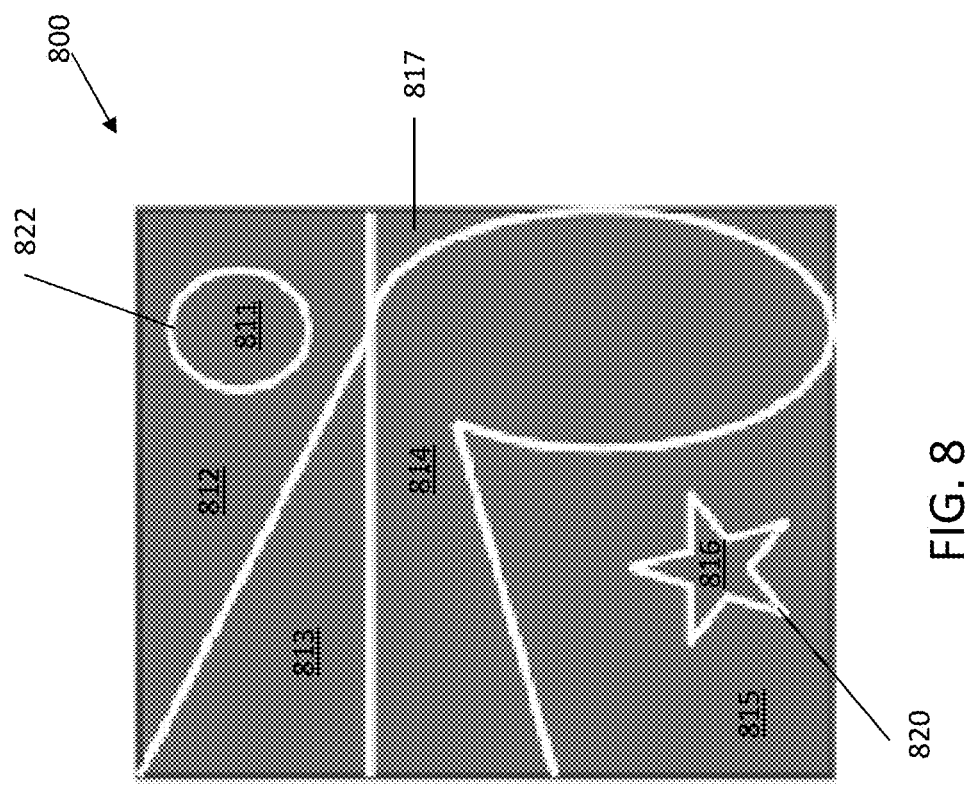
FIG. 8 illustrates an exemplary pixel conductor layer with a plurality of irregularly shaped pixel driving electrodes in accordance with the subject matter presented herein.

In some instances, unique display applications will require a display to use pixel or pixel segments of irregular geometric shapes. The present invention enables the assembly of a backplane for accommodating an electro-optic display with a plurality of irregular shaped display pixel segments at a cheap price. FIG. 8 illustrates a pixel conductor layer 800 for a backplane for driving an electro-optic display with a plurality of irregular shaped pixel segments. As illustrated in FIG. 8, the pixel conductor layer 800 may include a plurality of variable sized driving electrodes 811-817 for driving the plurality of irregular shaped pixel segments (not shown), where the shapes and positions of the driving electrodes 811-817 will match the shapes and positions of the corresponding pixel segments. In some embodiments, the pixel conductor layer 800 may be formed by coating a continuous layer of conducting material such as ITO onto a substrate. Other conductive materials may also be sputtered onto a substrate form the continuous layer, materials such as, but not limited to, various types of conductive oxides, gold, inert metals, nickel boron, carbon, carbon nanotubes, graphene, and poly(3,4-ethylenedioxythiophene) or also known as PEDOT. In some other embodiments, conductive material such as copper, nickel, aluminum, silver nanowires and printed silver may also be used depending on the specific requirements of the display application.

In an exemplary backplane assembling process in accordance with the subject matter presented herein, this continuous layer of conductive material may be scribed by a laser to pattern the various shaped driving electrodes 811-817. The scribing may cut deep enough into the conductive material layer to electrically isolate each driving electrodes but not so deep as to cut through the underneath substrate or substantially weaken the substrate to make it fragile. Laser scribing allows for the patterning of driving electrodes of various geometrical configurations without having to do photolithography or global alignments, which can be both expensive and prohibitively expensive for large sized backplanes. FIG. 8 illustrates star shaped 820 and circular 822 driving electrodes, but it should be appreciated that other geometrical shapes can be easily patterned using laser scribing or other comparable etching methods commonly adopted in the industry.

Figure 9:
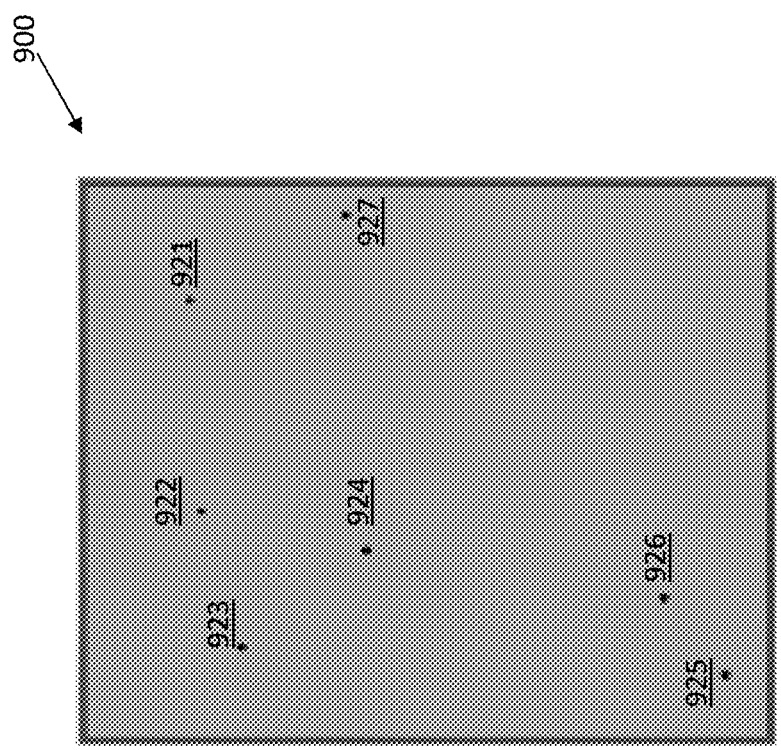
FIG. 9 illustrates an exemplary substrate for assemble a backplane in accordance with the subject matter presented herein.

Once the driving electrodes have been patterned, vias can be created through the substrate to connect the driving electrodes to driver circuits (not shown). FIG. 9 illustrates an exemplary substrate 900 in accordance with the subject matter presented herein. In some embodiments, the substrate 900 may be manufactured using materials such as PET, Polyethylene naphthalate (PEN), cyclic olefins, paper, fabrics, polyimide, or polycarbonate. To provide electrical connections to the driving electrodes 811-817 as shown in FIG. 8, one or more vias 921-927 may be created through the substrate 900 for each of the driving electrodes 811-817. Vias 921-927 may be created by cutting through the substrate 900 using lasers, but it should be appreciated that mechanical drilling or other puncturing methods commonly used in the art can be easily adopted. In some embodiments, a via cut into a driving electrode may be at least 200 µm in diameter and usually no more than 3 mm to minimize the appearance of the hole in the final display. It should appreciated that in other embodiments, vias may be formed before the driving electrodes have been patterned, for example, a substrate may come pre-fabricated with vias in place configured to backplane assembling.

After the vias 921-927 are created, conductive material (not shown) may be dispensed into the vias 921-927 with a porous paper behind the substrate and with vacuum pulling on the porous paper. The vacuum force will pull the conductive material through the vias 921-927 and plates the sides of the vias 921-927 or fill the volume of the vias 921-927, connecting the driving electrodes 811-817 to the reverse side of the substrate 900. It is preferred that the finished vias have surfaces co-planar with both the pixel conductor layer and the reverse side conductor layer to avoid bumps resulting from too much filler or lamination void due to insufficient via filling. In some embodiments, the vias 921-927 may be filled with a hot melt adhesive with a melting temperature around the lamination temperature of the electrophoretic ink material (e.g., 250F), provided that the flow viscosity of the hot melt adhesive is low enough to prevent ink capsule rupture.

The properly filled vias 921-927 can provide electrical connections between the driving electrodes 811-817 and the conductive traces that are to be formed on the reverse side (i.e., the side opposite to the pixel conductor layer) of the substrate 900. Prior to the formation of the conductive traces, in some embodiments, an ink FPL stack (not shown) may be firstly laminated to the driving electrodes 811-817. This is done in this fashion such that the thickness of the traces would not press through the substrate 900 and make impressions on the FPL layer during lamination.

The subsequent formation of the conductive traces may be carried out in various fashions. In some embodiments, conductive traces may be printed onto the reverse side beginning at the vias and extend according to a pre-determined layout for routing all of the lines from the pixel locations, without crossing, to one condensed area that matches the pad pitch for the electronics to be attached to the device. The printing of the conductive traces may be accomplished manually for small numbers of backplane units, or alternatively, an XY plotting machine with controlled dispensing of printable conductive material may be used. Camera vision alignment may be adopted to locate the vias and a XY plotter may be aligned to that location to start drawing the conductive traces. It should be appreciated that other trace producing methods commonly used in the industry can be conveniently adopted, methods such as, but not limited to, inkjet with conductive inks, rollers, tapes, etc. Some examples of suitable trace materials are silver or carbon filled printing inks. In this fashion, no global alignment may be required to create the conductive traces. For example, local alignment may be perfectly sufficient to places the traces to connect the vias to a driver circuit. By not having to perform global alignments, large sized (e.g., backplanes larger than 24 inches by 48 inches in sizes) backplanes can be conveniently assembled because global alignments can be hard to design for and expensive to perform.

Figure 10:
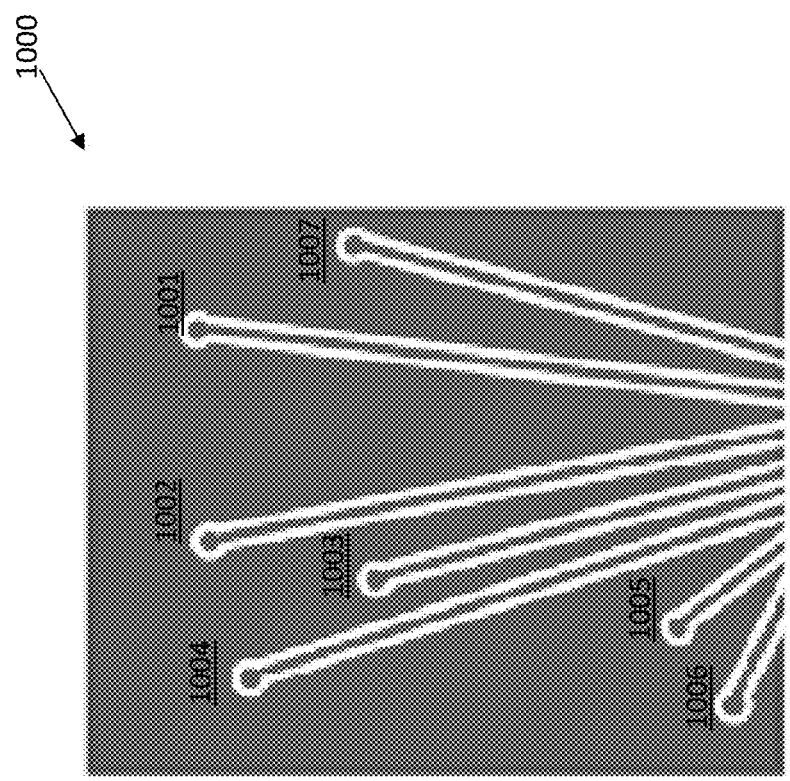
FIG. 10 illustrates a reverse side conductor layer with conductive traces in accordance with the subject matter presented herein.

Alternatively, conductive traces may be etched or scribed onto a continuous conductive layer, similar to the patterning of the driving electrodes 811-817 mentioned above. In some embodiments, a continuous layer of conductive material may be coated on the reverse side of the substrate 900. After the FPL stack has been laminated onto the driving electrodes 811-817, conductive traces may be etched into the continuous conductive layer with a laser such that each conductive trace is electrically isolated but not cutting into the substrate enough to cut through or make it fragile. FIG. 10 illustrates an exemplary reverse side 1000 of the substrate 900 presented in FIG. 9 with conductive traces 1001-1007 etched into a continuous conductive layer in accordance with the subject matter presented herein. As illustrated, the cutting of each conductive trace can include the via for the driving electrode and a small circle around the via adding the width of the conductive trace around each via to ensure continuity to that driving electrode. The alignment to each via may be accomplished with a camera vision alignment system to find and align to each via to locate the conductive trace path. The conductive traces 1001-1007 can extend in a pre-determined layout for routing all of the lines from the pixel locations, without crossing, to one condensed area that matches the pad pitch for the electronics to be attached to the device.

For conductive fabric designs, it may be convenient to firstly produce patterns for the driving electrodes and the conductive traces, then paste them onto a substrate which could be a fabric or film depending on the requirements of the display application. Other suitable substrate material include PET, Polyethylene naphthalate (PEN), cyclic olefins, paper, fabrics, polyimide, or polycarbonate, etc.

In general, variations can be made to the backplane assembly processes described above while still producing backplanes that are substantially comparable in performances. For example, roll to roll machines may be used to assemble backplanes that are in accordance with the subject matter presented herein. In some embodiments, continuous rolls of substrate coated with conductive materials can be processed at multiple assembling stations including a laser cutting/etching station and a XY plotting station, both equipped with camera vision alignment systems. These two stations may be distinct units or may be part of a single assembly station (e.g., both the laser cutter and the plotter can be part of an XY gantry system). Furthermore, a roll to roll machine may further include a station for heated lamination of ink FPL or other materials for assembling display units. This arrangement can be advantageous for at least the reason that the conductive traces can now be radiation cured (e.g., UV cured) at the roll to roll machine, which saves production time and cost by not having to use conventional heat drying ovens.

In another embodiment, vias can be cut in a substrate roll prior to the deposition of conductive materials, which permits the filling of the vias using the deposited conductive material. In this fashion, a separate assembling step to fill the vias may be eliminated, further reducing production cost.

In yet another embodiment, vias may be left unfilled prior to the lamination of the FPL to a display stack. The subsequent dispensing of the conductive traces to the reverse side of the substrate can in effect fulfill the vias to provide connection between the driving electrodes and the conductive traces.

From the foregoing, it will be seen that the present invention can provide processes for assemble large sized backplanes for electro-optic displays conveniently and cheaply. Because the backplanes can be assembled using laser scribing and local alignments, there is no need for otherwise expensive machineries to accommodate the large size requirement and the irregular driving electrode shapes.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A method for producing a backplane for electro-optic displays comprising:
    providing a substrate coated with a first conductive material on a first side and a second conductive material on a second side, the second side being positioned opposite from the first side, wherein the substrate is at least 24 inches by 48 inches in size;
    patterning the first conductive material by scribing the first conductive material, wherein the patterning of the first conductive material creates electrical isolated conductive segments to be controlled by a driver circuit;
    creating a plurality of vias through the substrate, the plurality of vias extending through the substrate and providing electrical conductivity between the first and second sides; and
    creating a plurality of conductive traces on the second side of the substrate by patterning the second conductive material by locally align the vias to the driver circuit.

2. The method of claim 1, wherein the pattering the first conductive material step comprising cutting through the first conductive material using mechanical forces.

3. The method of claim 1, wherein the patterning the first conductive material step comprising cutting through the first conductive material using a beam of energy or particles.

4. The method of claim 3, wherein cutting through the first conductive material comprising using a laser.

5. The method of claim 4, wherein the creating a plurality of conductive traces step comprising placing conductive material from the vias to the driver circuit.

6. A method for producing a backplane for electro-optic displays comprising:
    providing a substrate coated with a first conductive material on a first side, wherein the substrate is at least 24 inches by 48 inches in size;
    patterning the first conductive material by scribing the first conductive material, wherein the patterning of the first conductive material creates electrical isolated conductive segments to be controlled by a driver circuit;
    creating a plurality of vias through the substrate, the plurality of vias extending through the substrate; and creating a plurality of conductive traces on a second side of the substrate connecting the vias to the driver circuit, the second side being position opposite to the first side of the substrate.

7. The method of claim 6, wherein placing conductive material comprising using a plotter to place conductive material between the vias and the driver circuit.

\* \* \* \* \*